(12) United States Patent
Makiyama et al.

(10) Patent No.: US 6,509,252 B1
(45) Date of Patent: Jan. 21, 2003

(54) METHOD OF MANUFACTURING SEMICONDUCTOR DEVICE

(75) Inventors: Kozo Makiyama, Machida (JP); Katsumi Ogiri, Yamanashi (JP)

(73) Assignees: Fujitsu Limited, Kawasaki (JP); Fujitsu Quantum Devices Ltd., Yamanashi (JP)

( * ) Notice: Subject to any disclaimer, the term of this patent is extended or adjusted under 35 U.S.C. 154(b) by 0 days.

(21) Appl. No.: 10/114,452

(22) Filed: Apr. 3, 2002

(30) Foreign Application Priority Data

Oct. 30, 2001 (JP) ............................ 2001-333457

(51) Int. Cl.$^7$ ............... H01L 21/20; H01L 21/44; H01L 21/4763
(52) U.S. Cl. ............... 438/584; 438/579; 438/585
(58) Field of Search ................... 438/584, 579, 438/585, 586, 172, 574, 185

(56) References Cited

U.S. PATENT DOCUMENTS

| | | | | |
|---|---|---|---|---|
| 4,679,311 A | * | 7/1987 | Lakhani et al. | 438/574 |
| 5,369,044 A | * | 11/1994 | Shimura | 438/579 |
| 5,550,065 A | * | 8/1996 | Hashemi et al. | 148/DIG. 100 |
| 5,569,944 A | * | 10/1996 | Delaney et al. | 257/197 |
| 5,585,289 A | * | 12/1996 | Kitano | 438/185 |
| 5,766,967 A | * | 6/1998 | Lai et al. | 438/579 |
| 6,153,499 A | * | 11/2000 | Anda et al. | 438/579 |
| 6,258,713 B1 | * | 7/2001 | Yu et al. | 438/584 |
| 6,291,282 B1 | * | 9/2001 | Wilk et al. | 438/584 |
| 6,294,801 B1 | * | 9/2001 | Inokuchi et al. | 438/172 |
| 6,326,287 B1 | * | 12/2001 | Asahina et al. | 438/584 |
| 6,329,256 B1 | * | 12/2001 | Ibok | 438/584 |
| 6,362,084 B1 | * | 3/2002 | Nakamura et al. | 438/584 |
| 6,391,774 B1 | * | 5/2002 | Takewaki | 438/584 |

* cited by examiner

Primary Examiner—John F. Niebling
Assistant Examiner—Walter L. Lindsay, Jr.
(74) Attorney, Agent, or Firm—Armstrong, Westerman & Hattori, LLP

(57) ABSTRACT

A method of manufacturing a semiconductor device includes an exposing step of transferring a support pattern onto an non-exposed area of a resist layer so that an opening for forming a support is formed in a thick part of the resist layer. The support is formed simultaneously with a gate electrode in a body using the resist layer having the opening. The gate electrode on a mesa extending into the outside of the mesa is supported by both a mesa layer and the support.

13 Claims, 14 Drawing Sheets

PRIOR ART

METHOD OF MANUFACTURING SEMICONDUCTOR DEVICE

BACKGROUND OF THE INVENTION

1. Field of the Invention

The present invention relates to methods of manufacturing field effect transistors, and particularly relates to a method of forming a gate electrode on the upper surface of a mesa layer so as to extend to the outside of the mesa layer.

2. Description of the Related Art

FIG. 1 is a sectional view showing a structure of a known field effect transistor. The known field effect transistor comprises a mesa layer 2 on a semiconductor substrate 1, such as InP or GaAs, as shown in FIG. 1. The mesa layer 2 has a gate electrode 3, a source electrode 4, and a drain electrode 5 thereon.

The gate electrode 3 of the field effect transistor shown in FIG. 1 comprises a fine gate electrode 3A serving as a control gate and an over gate 3B provided on the fine gate 3A to lower the resistance of the gate electrode 3. The over gate 3B has a width larger than that of the fine gate 3A.

The mesa layer 2 has layers for operating the field effect transistor, that is, common semiconductor components required for operating the transistor, including a channel layer. Thus, the field effect transistor formed in a mesa is separated from other adjacent semiconductor devices.

FIG. 2 is a plan view of the known field effect transistor shown in FIG. 1, illustrating the vicinity of the end of the gate electrode 3. The same parts are designated by similar numerals.

In the field effect transistor having the mesa layer 2, the relationship with the relative position between the end of the gate electrode 3 and the periphery of the mesa layer 2 is important. In FIG. 2, the mesa layer 2 is represented as a boundary defining the periphery of the mesa layer 2. In this field effect transistor, the end of the gate electrode 3 or at least the fine gate 3A serving as a substantial gate electrode extends to the outside of the periphery of the mesa layer 2, and it is across the boundary.

The reason why such an extending of the gate electrode 3 to the outside of the periphery is needed, is described as follows.

Exposures of a pattern defining the periphery of the mesa layer 2 and a gate electrode pattern, particularly a fine gate pattern, are each performed in a different step.

As a result, an alignment error is caused between the pattern defining the periphery of the mesa layer 2 and the gate electrode pattern. Even if the exposures, therefore, are performed on the condition that the periphery of the mesa layer 2 is aligned with the end of the gate electrode 3, unfortunately the end of the gate electrode 3 occasionally lies inside the periphery. In such a case, the gate electrode 3 does not control any channel in the area of the mesa layer 2 which does not have the gate electrode 3 thereon, consequently causing a leak current between the source and the drain, flowing in a detour around the end of the gate electrode 3.

In order to prevent the leak current, it is necessary to extend the gate electrode 3 (the fine gate 3A) to the outside of the mesa layer 2. The size of this protruding portion is determined in consideration of the alignment error between the pattern defining the periphery of the mesa layer 2 and the gate electrode pattern.

Nevertheless, the field effect transistor described above has often the wide dispersion of the electrical characteristics, as a result does not ensure an adequate process yield.

SUMMARY OF THE INVENTION

The inventors investigated defects in the conventional field effect transistor described above with a scanning electron microscope (SEM), and found that the end of gate electrode 3 is occasionally separated from the mesa layer 2.

FIG. 3 is a sectional view showing the separation of the gate electrode 3 caused in the vicinity of the periphery of the mesa layer 2. The part inscribed by a circle 301 shows this separation. FIG. 3 shows that the fine gate 3A and the over gate 3B, which are included in the gate electrode 3 together, are separated from the mesa layer 2 in the vicinity of the end of the gate electrode 3. This separated part is more likely to degrade channel controllability of the gate electrode 3 than the other non-separated part, and is therefore likely to cause leak current and the degradation of current/voltage characteristics, thus leading to a lowered process yield or a degraded performance of the field effect transistor.

Supposedly, the separation of the gate electrode 3 arises from the overhanging gate electrode 3 supported by the mesa layer 2 in a cantilever manner. The gate electrode 3 is subjected to stress in a gate electrode-forming process, such as vapor deposition, or another subsequent process. In such a gate electrode 3 as being supported in a cantilever manner, the stress is concentrated on the periphery of the mesa layer 2 where the gate electrode 3 is supported, thereby probably causing the separation. Even when the separation does not occur, the periphery of the mesa layer 2 is subjected to the stress, and therefore the gate electrode 3 cannot apply an electric field according to the design. Thus, the electrical characteristics of the field effect transistor fluctuate.

The following describes how the general field effect transistor has such an overhanging gate electrode, with reference to a process of a gate electrode. FIGS. 4A and 4B are sectional views showing a known process of a gate electrode. First, as shown in FIG. 4A, a resist for forming the fine gate 3A is coated on the substrate 1 having the mesa layer 2 thereon to form a resist layer 10. Although other resist layers are required to form the over gate 3B, they are omitted from the description for the sake of clarity.

The resist layer 10 is formed so that the thickness thereof on the mesa layer 2 has a thickness sufficient to form the gate electrode 3, for example, in this case, a thickness larger than the height of the fine gate 3A. In the area of the resist layer 10 which the mesa layer 2 does not underlie, the surface of the resist layer 10 gradually slopes down from the periphery of the mesa layer 2 to the outside. The gradient of this slope depends on the viscosity and the curing condition of the resist for the resist layer 10. The thickness of the resist layer 10, therefore, does not decrease suddenly at the periphery of the mesa layer 2.

Thus, the resist layer 10 has a larger thickness in the vicinity of the mesa layer 2 than at the part overlying the mesa layer 2 and at the part far away from the mesa layer 2.

The amount of exposure of the gate electrode pattern, more specifically the fine gate pattern in this case, must be as small as possible. This is because an increased amount of exposure, both of light exposure and electron beam exposure, leads to an unsharped image. In particular, when an extremely fine technique is required as in the case of the gate electrode 3, the amount of exposure is crucial.

However, since the resist layer 10 has a larger thickness in the vicinity of the mesa layer 2, this minimum amount of exposure, which is followed by development, results in a non-exposed area 10B left under an exposed area 10A, as shown in FIG. 4B.

After the exposed area 10A is removed, the resist layer 10 is provided with a material for the gate electrode 3 thereon, and then the gate electrode 3 will be formed by a lift-off process. At this point, the residual non-exposed area 10B is also provided with the material for the gate electrode 3 thereon, and is removed in the following lift-off process. Thus, the gate electrode 3 overhangs in a cantilever manner. As described above, the non-exposed area 10B which is not removed before providing the electrode material causes the gate electrode 3 to overhang.

On the other hand, the thickness at the part far away from the mesa layer 2 is equal to the thickness at the area overlying the mesa layer 2. If the gate electrode pattern is extended to the part far away from the mesa layer 2, the non-exposed area does not occur at least under the end of the gate electrode 3, and consequently the gate electrode 3 is supported at both the end thereof and the mesa layer 2. Unfortunately, in such a structure, the end of the gate electrode 3 extends to the part far away from the mesa layer 2, and thus the completed transistor occupies a larger area. This structure, therefore, is not advantageous in terms of integration density and increases parasitic capacitance of the gate electrode 3.

Thus, the field effect transistor described above causes large dispersion of the electrical characteristics and does not ensure an adequate process yield.

Accordingly, an object of the present invention is to provide a method of manufacturing a semiconductor device having stable electrical characteristics.

To this end, according to one aspect of the present invention, there is provided a method of manufacturing a semiconductor device which has a gate electrode on a mesa layer formed on a substrate. The method comprises a step of forming a resist layer on the mesa layer on the substrate, so that the resist layer has a thick part in the vicinity of the mesa layer. The thick part has a thickness larger than that of the resist layer on the mesa layer. A first exposing step is comprised to transfer a gate electrode pattern for defining a first opening which determines the gate electrode shape onto the resist layer. In a second exposure step, a support pattern for defining a second opening which determines a support shape is transferred onto the resist layer so that a second opening piercing trough the resist layer. The second opening and an end of the first opening overlap with each other in the thick part of the resist layer. In a developing step, the gate electrode pattern and the support pattern exposed in the resist layer are developed to form the first opening and the second opening, so that the first and the second opening are combined into a third opening formed in the resist layer. As result, a resist pattern having the third opening is formed. Over the resist pattern, the gate electrode material is deposited on the substrate, then the material deposited on the resist pattern is lifted off. Consequently the gate electrode and the support are formed in a body, wherein the end of the gate electrode is propped by the support.

The support is formed in the second opening which exposes the surface of the substrate therein, then the support is disposed on the surface of the substrate and props the end of the gate electrode extending above the support. As a result, the gate electrode formed on the mesa layer extends across the periphery of the mesa layer into the support position, be supported at both the end of the gate electrode with the support and the mesa layer. Thus, the separation of the gate electrode can be prevented.

Here, the surface of the substrate may have a buffer layer, a surface protection layer, or other layers.

Since the first exposing step and the second exposing step are each performed individually, the amount of exposure of the gate electrode pattern can be small and the amount of exposure of the support pattern can be large. A large amount of exposure of the support pattern ensures the formation of the deep and piercing second opening for forming the support, and a small amount of exposure of the gate electrode ensures the formation of a highly accurate first opening for forming the gate electrode. Thus, the gate electrode is reliably supported, and therefore the process yield increases. Also, the fluctuation of the characteristics of semiconductor devices arising from the separation is prevented. In addition, the dispersion of the characteristics is reduced because of the accurately formed gate electrode.

In order to support the end of the gate electrode, the support may be formed before forming the gate electrode. In this instance, the support must be formed in the second opening by a lift-off process or the like before the exposure of the gate electrode pattern.

However, this procedure needs to repeat the series of an exposure, a development, and a lift off process twice, and therefore the manufacturing process must be complicate and time-consuming. In addition, the gate electrode pattern and the support pattern each need aligning with the mesa layer, and consequently, the alignment error between the gate electrode and the support become large. In order to form the support by a lift-off process, the second opening for forming the support, hopefully, has an overhang portion protruding over the opening from the top of the resist layer. Unfortunately, it is difficult to form an opening having such a shape in the thick part of the vicinity of the mesa layer, where the thickness distribution is large. Therefore, in view of the alignment error, the supporting portion has to be formed far away from the periphery of the mesa layer, then the area of the field effect transistor increases.

In the present invention, therefore, the gate electrode and the supporting portion are simultaneously formed together using the resist pattern having the third opening which is combination of the first opening for forming the gate electrode and the second opening for forming the support.

In the present invention, development is performed once or twice and a lift-off process is performed once. The gate electrode and the support, therefore, can be formed in a simple process. Also, since the two exposures may be performed after aligning the patterns with the mesa layer, the second alignment is not necessary and thus the alignment error decreases. In addition, since the support can be formed with the gate electrode material in the second opening for forming the support, the second opening does not need to have the overhang portion. The opening, therefore, can be formed in the thick part of the resist layer in the vicinity of the mesa layer, and thus the support is readily formed in the vicinity of the mesa layer to prevent the area of the field effect transistor from increasing. The two exposures may be performed in succession without intervention of any other step, such as alignment.

In addition, by forming the gate electrode integrated with the supporting portion together, the adhesion strength between the gate electrode and the supporting portion, which is likely to cause a problem when the gate electrode and the supporting portion are each formed independently, is improved. If forming the support precedes forming the gate electrode, an adhesion layer is required on the upper surface of the support or the under surface of the gate electrode in order to increase the adhesion; hence another step of depositing the adhesion layer is required. If the adhesion layer is provided under the gate electrode, a material which does not degrade gate electrode characteristics such as Schottky characteristics must be selected. The method of the present invention does not need to consider these problems, thus facilitating the design and the manufacturing of the semiconductor devices.

In the method of the present invention, the second exposing step may precede the first exposing step; hence, the support pattern is transferred before the gate electrode pattern.

The support pattern and the gate electrode pattern may be simultaneously developed to form the resist pattern. Thus, the process of the developments can be shortened. The alignment for the two exposures, which are performed before the developments, is required only once, and thus both the alignment error and the operation time decrease.

Each of the developing steps for developing the electrode pattern and for developing the support pattern may be individually performed. Thus, the developments of the support pattern and the gate electrode pattern are performed at each suitable amount so that the second opening for forming the support reliably extends to the surface of the substrate and that the first opening for forming the gate electrode is precisely formed.

The first exposure step and the developing step for developing the gate electrode pattern may precede the second exposure step. The resist layer becomes thinner by the development step of the gate electrode pattern. The second exposure is performed onto this thinner resist layer, and therefore the support pattern is precisely formed.

The second exposure step and the developing step for developing the support pattern may precede the first exposure step.

The area exposing the substrate surface in the second opening for forming the support pattern may have a width smaller than that of the gate electrode pattern in the gate length direction. Thus, the support opening is formed within the area of the gate electrode. The opening is inhibited from extending to the outside of the gate electrode, which is originally not for any device area, and thus the area of the field effect transistor is minimized.

The area exposing the substrate surface in the second opening for forming the support pattern may have a width larger than that of the gate electrode on the surface of the mesa layer in the gate length direction.

As a result, the contact of the surface of the substrate with the end of the gate electrode has a width larger than the gate length in the gate length direction. In this instance, since the support does not protrude in the longitudinal deletion of the gate electrode, the area of the field effect transistor does not increase in substance.

The gate electrode may comprise a fine gate and an over gate formed on the fine gate. The over gate is wider than the fine gate. The gate electrode pattern and the support pattern may result in the fine gate.

The method may further comprise a step of forming an fourth opening for forming the over gate. The fourth opening is formed in an upper resist layer disposed on the resist layer.

The upper resist layer may have the overhang portion over the fourth opening. The upper resist layer may be a laminated layer comprising a first resist lamina and a second resist lamina. The first lamina in which fourth opening is formed, then the vertical walls of the fourth opening are formed from the first lamina. The second lamina is disposed on the first lamina and forms the overhang portion protruding over the fourth opening from the top of upper resist layer.

DESCRIPTION OF THE PREFERRED EMBODIMENTS

The embodiments will now be described with reference to drawings.

First Embodiment

FIGS. 5A to 11B are sectional views illustrating a process of manufacturing a field effect transistor according to a first embodiment of the present invention, showing a vicinity of a gate electrode of the field effect transistor. FIGS. 5A, 6A, 7A, 8A, 9A, 10A, and 11A show a section in the gate length direction and FIGS. 5B, 6B, 7B, 8B, 9B, 10B, and 11B show a section of an end of the gate electrode in the direction perpendicular to the gate length direction.

Figure 1:
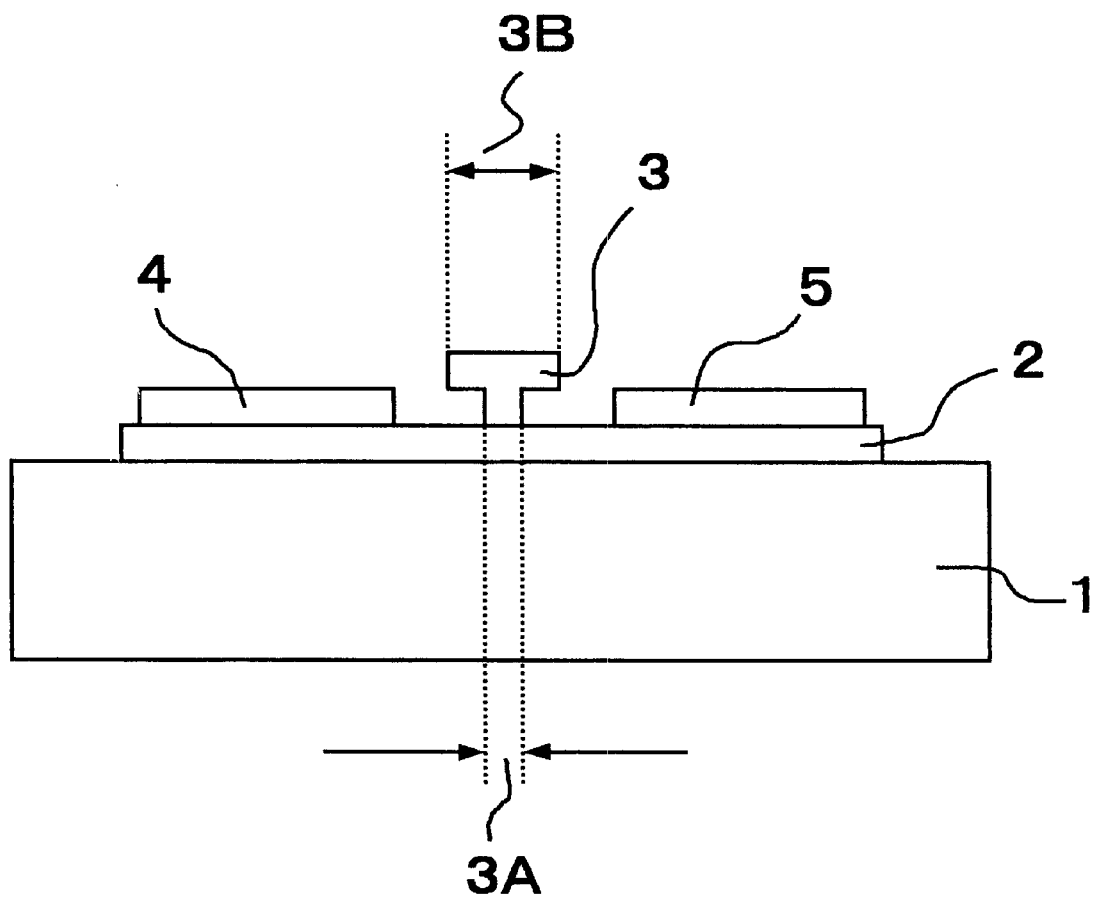
FIG. 1 is a sectional view of a known field effect transistor.
Figure 2:
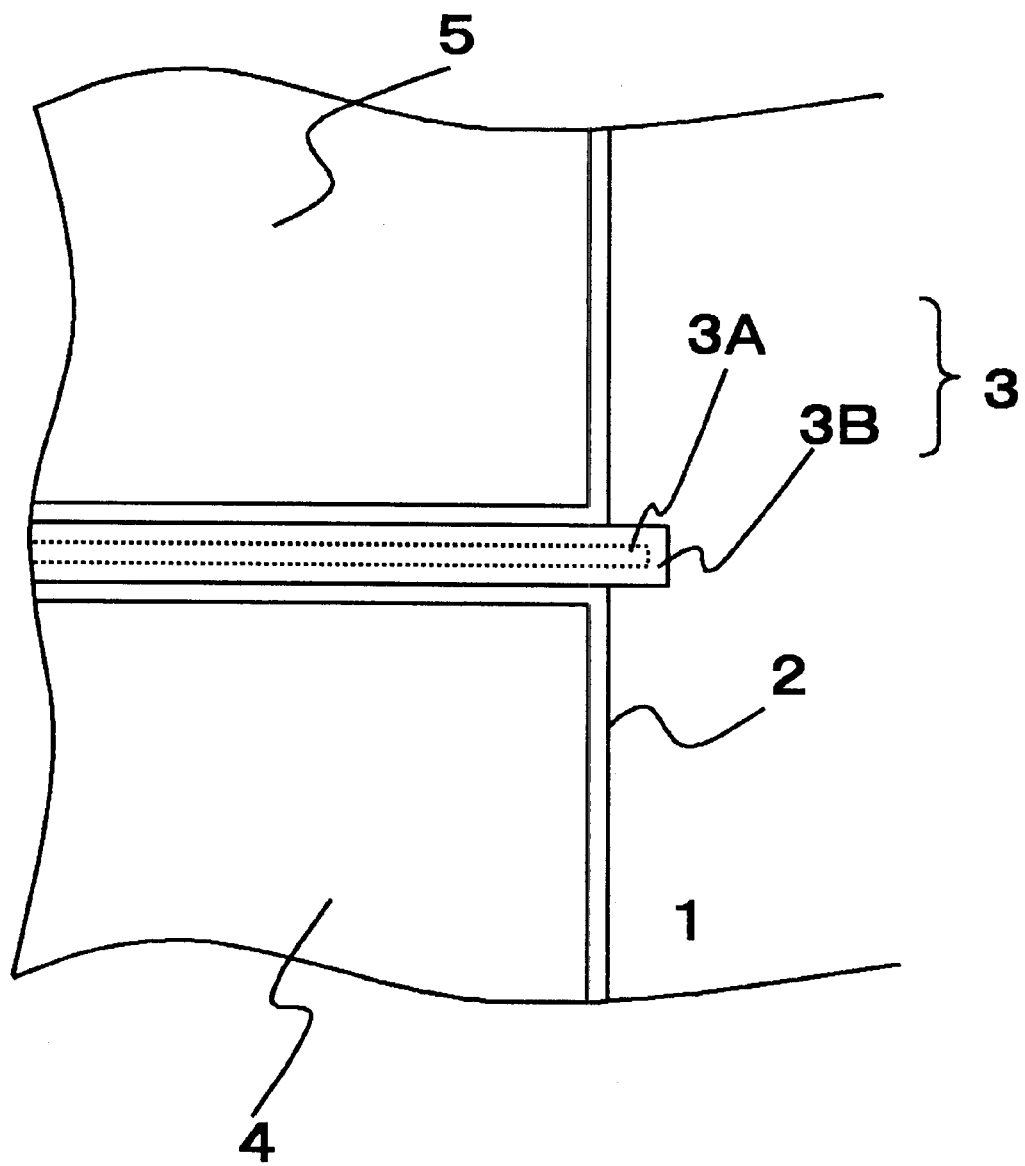
FIG. 2 is a plan view of the known field effect transistor.
Figure 3:
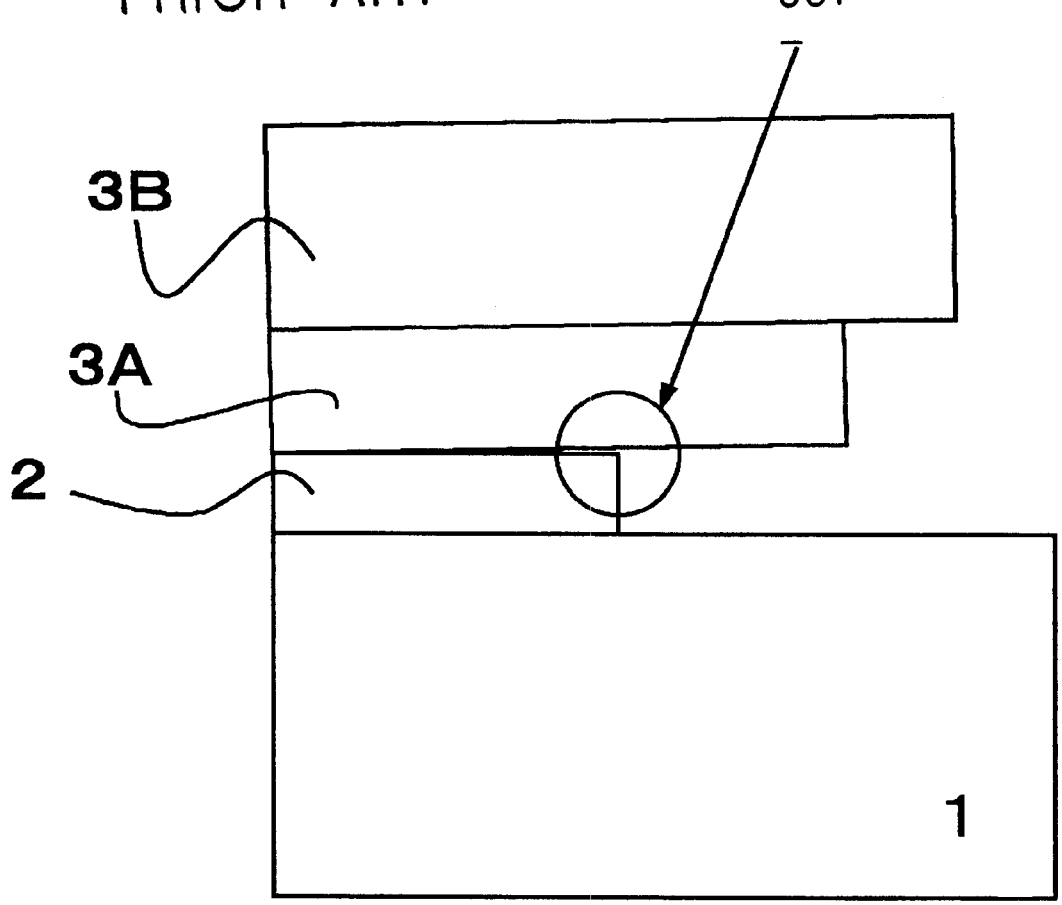
FIG. 3 is a drawing illustrating a problem in a known field effect transistor.
Figure 4A:
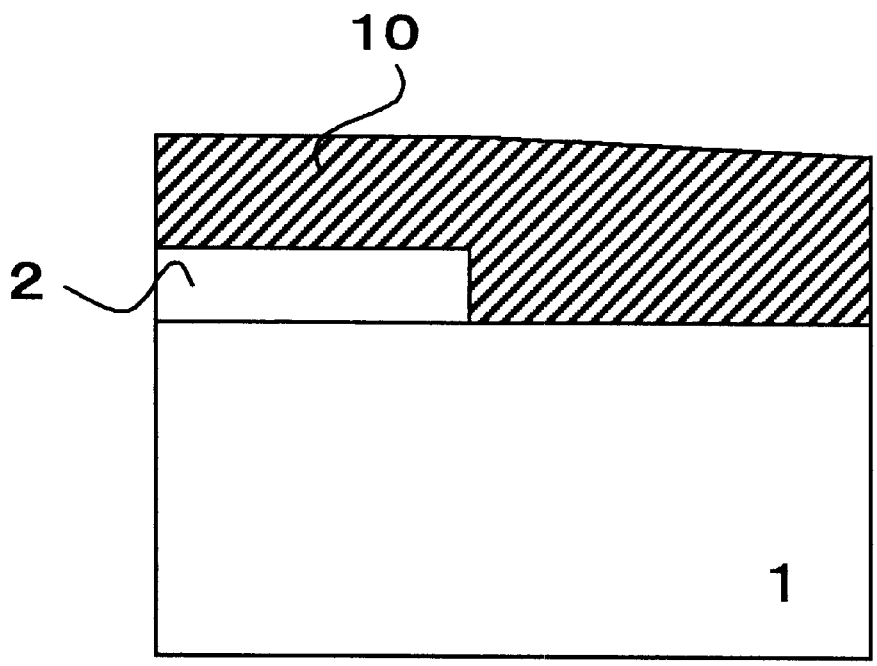
FIGS. 4A and 4B are sectional views showing a process of manufacturing the known field effect transistor.
Figure 4B:
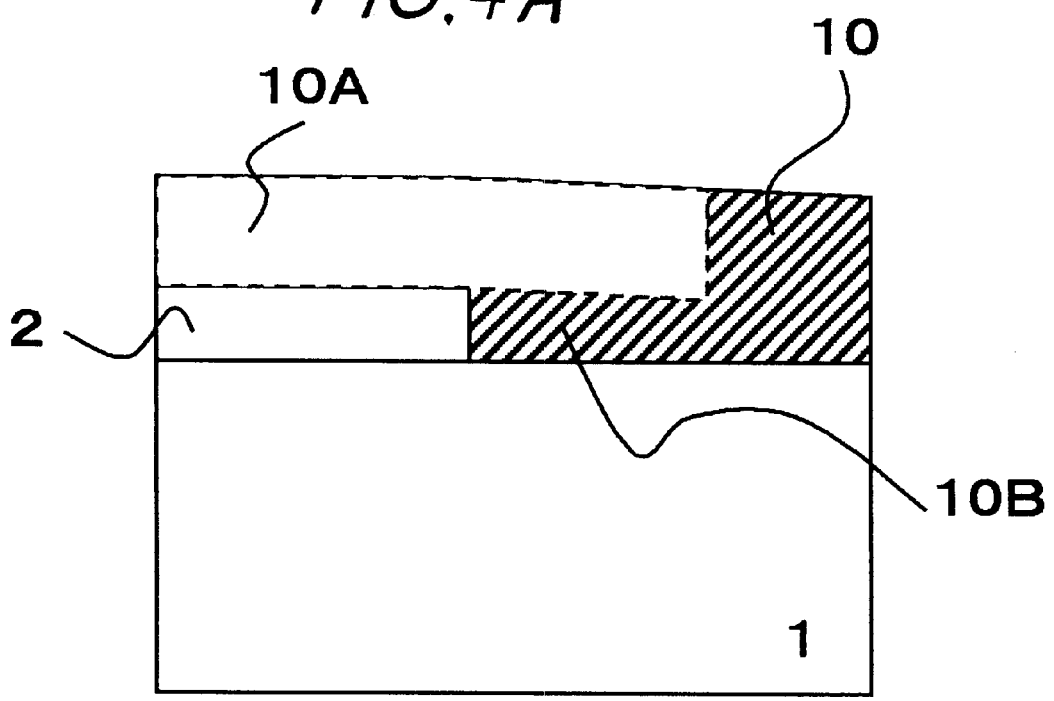

In the first embodiment, a field effect transistor has the same structure on a mesa layer as known field effect transistors. The transistor comprises the mesa layer 2 formed on the substrate 1, the gate electrode 3 having the fine gate 3A serving as a substantial gate electrode and the over gate 3B disposed on the fine gate 3A, the source electrode 4, and the drain electrode 5, as shown in FIG. 1.

Figure 5A:
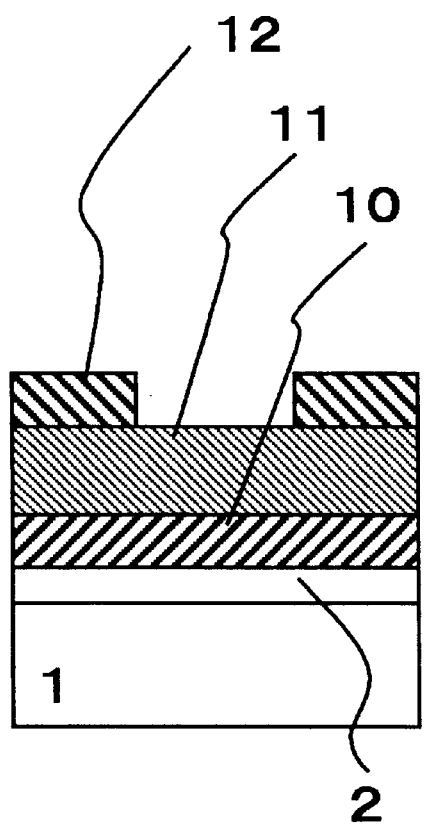
FIG. 5A–FIG. 11B are sectional views showing steps of manufacturing a field effect transistor according to a first embodiment of the present invention.
Figure 5B:
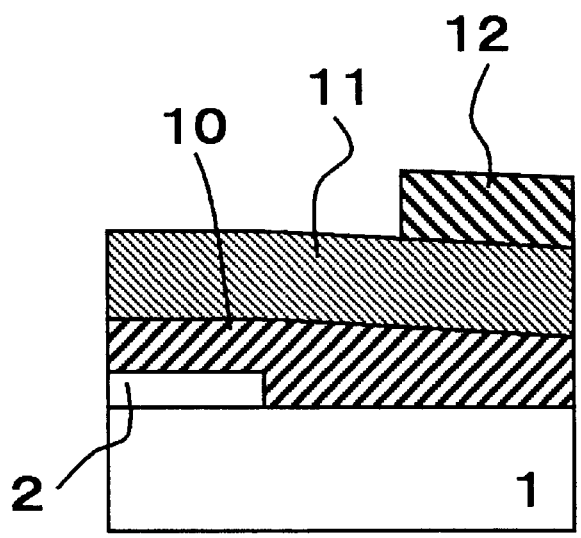

First, as shown in FIGS. 5A and 5B, the resist layer 10, the fist resist lamina 11, the second resist lamina 12 are formed over the mesa layer 2 on the substrate 1 by a known spin coating method. The first and the second resist lamina form the upper resist layer. The resist layers 10 to 12 are formed as follows.

The Resist Layer 10
  Material: polymethylmethacrylate (PMMA) resist for electron beam exposure, such as ZEP2000 produced by Zeon Corporation
  Thickness: 300 nm
  Curing temperature and time: 185° C., 10 min
First Resist Lamina 11
  Material: alkali-soluble resist, such as PMGI(Trade Name) produced by MicroChem Corporation
  Thickness: 500 nm
  Curing temperature and time: 185° C., 5 min
Second Resist Lamina 12
  Material: polystyrene resist for electron beam exposure, such as ZEP520-A7 produced by Zeon Corporation
  Thickness: 300 nm
  Curing temperature and time: 185° C., 5 min Resulting the resist layer 10 has large thickness in the vicinity of the mesa layer 2.

Next, an electron beam exposure of a pattern defining the over gate 3B (see FIG. 1) is performed onto the second resist lamina 12, followed by development and rinse. Thus, the second resist lamina 12 has an opening defining the over gate 3B. An end of this opening extends to the outside of the mesa layer 2, as shown in FIG. 5B.

Figures 6A, 6B:
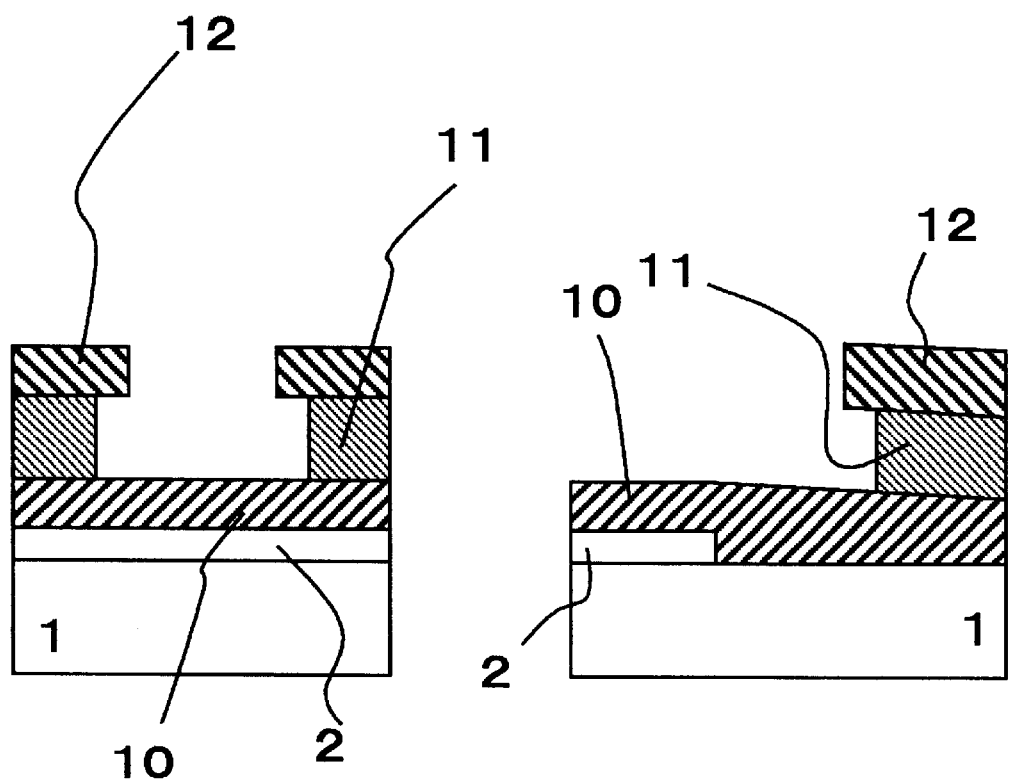

Turning to FIGS. 6A and 6B, the first resist lamina 11, which is exposed at the bottom of the opening formed in the step shown in FIGS. 5A and 5B, is patterned by etching, using the third resist layer 12 as a mask. The first resist lamina 11 has etch selectivity with respect to the resist layer 10 and the second resist lamina 12, and this etching is continued until side etching occurs. Thus, the fourth opening for forming the over gate is formed in the first and second resist lamina 11 and 12, so that the second resist lamina 12 forms the overhang portion protruding into the fourth opening.

The etching is performed under the following conditions.

Etchant: aqueous solution of tetramethylammonium hydroxide (TMAH)

Etching time: 30 second

Figures 7A, 7B:
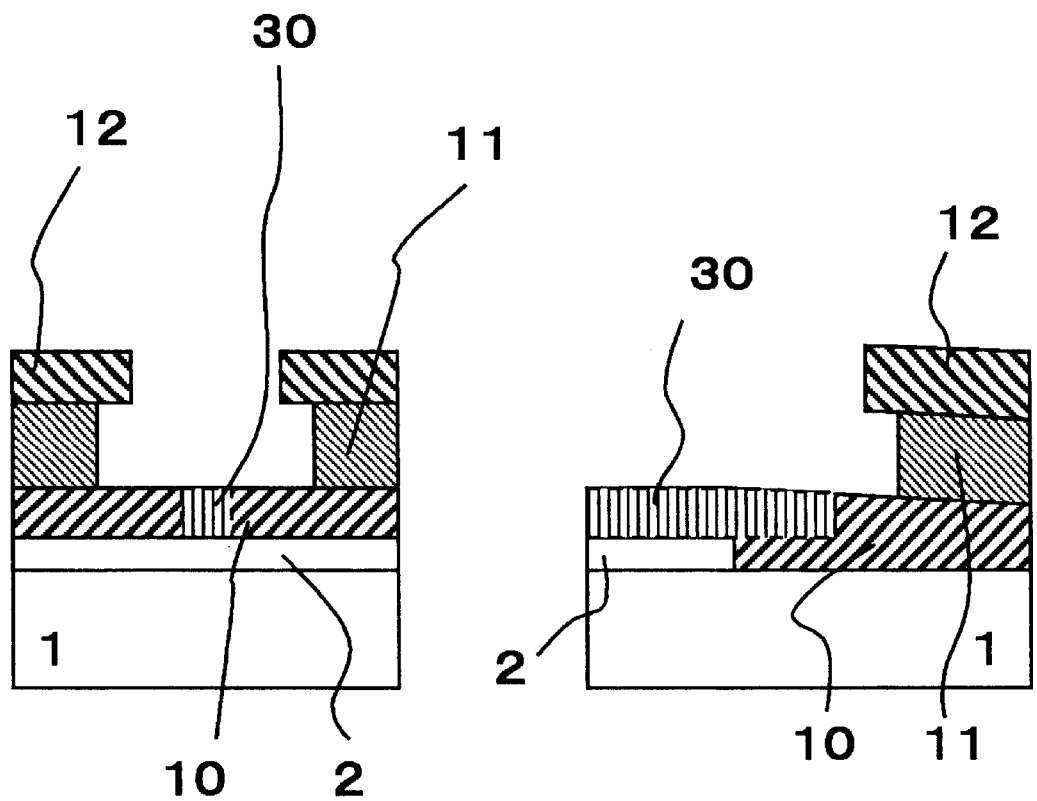

Turning to FIGS. 7A and 7B, an electron beam exposure for transferring a fine gate pattern 30 is performed onto the resist layer 10 exposed at the bottom of the fourth opening for forming the over gate 3B formed in the step shown in FIGS. 6A and 6B.

In this instance, the exposure is at a minimum to reach the undersurface of the part of the resist layer 10 overlying the mesa layer 2 in consideration of the thickness distribution of the resist layer 10.

Exemplary conditions of the exposure of the fine gate pattern 30 are a dose of 200 μC and an accelerating voltage of 50 keV.

Thus, a non-exposed area arises in the resist layer 10 in the vicinity of the mesa layer 2 from the insufficient exposure, underlying the fine gate pattern 30.

Figure 8A:
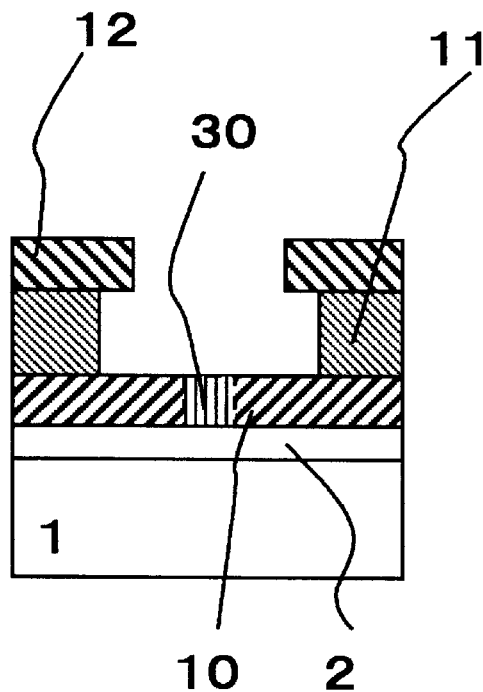
Figure 8B:
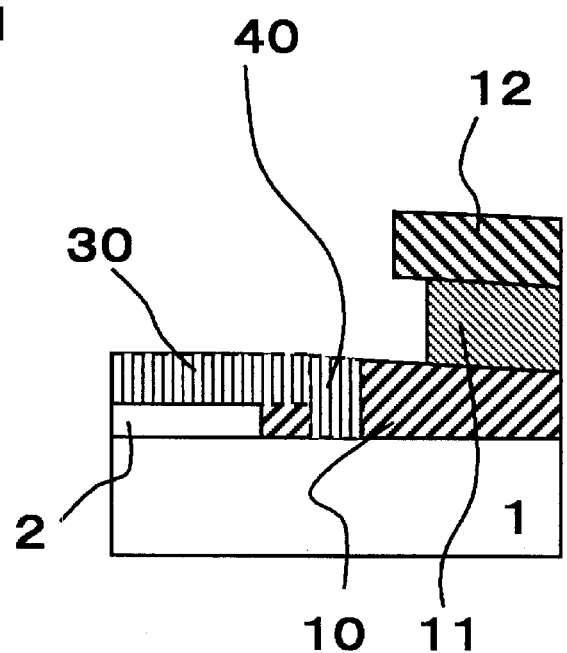

Turning to FIGS. 8A and 8B, another exposure for transferring a support pattern 40 is performed onto the thick part of the resist layer 10 in the vicinity of the mesa layer 2. As shown in FIG. 8B, this exposure is sufficient to reach the undersurface of the non-exposed area under the fine gate pattern 30.

Exemplary conditions for the exposure of the support pattern 40 are a dose of 100 μC and an accelerating voltage of 50 keV.

Figure 9A:
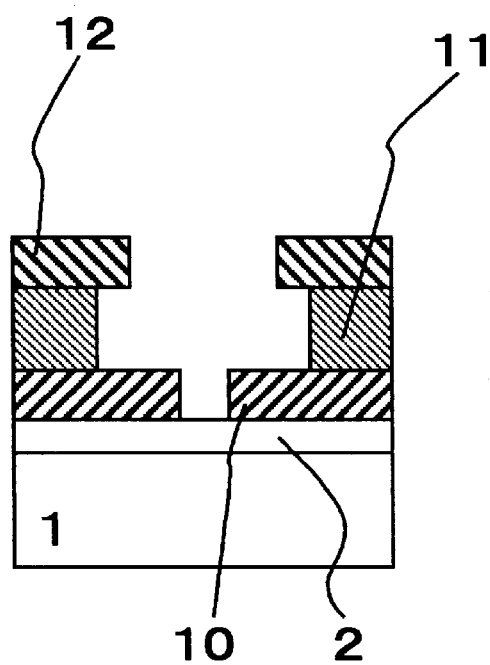
Figure 9B:
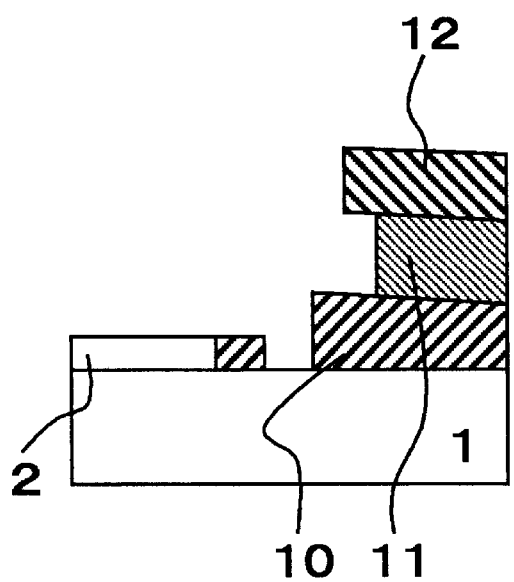

Next, the resist layer 10 exposed in the steps shown in FIGS. 7A to 8B is developed and rinsed to form a resist pattern having the first opening for forming the fine gate 3A and the second opening for forming the support 3C, as shown in FIGS. 9A and 9B.

Figures 10A, 10B:
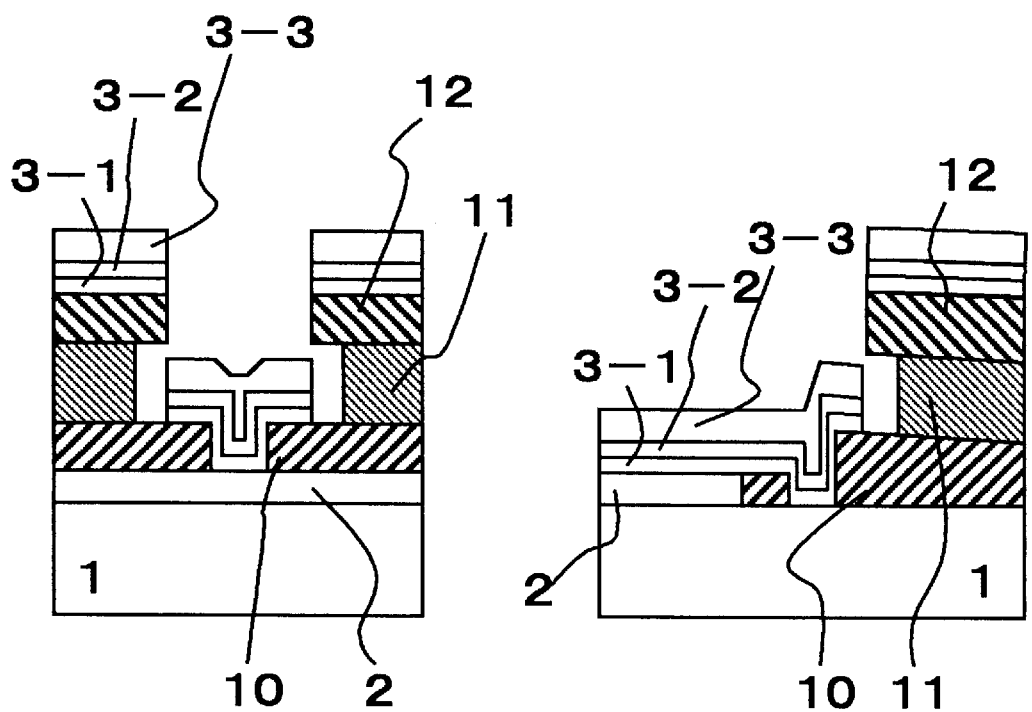

Turning to FIGS. 10A and 10B, a gate electrode material is deposited on the entire substrate including the resist pattern. The gate electrode 3 is composed of the following three layers:

Ti layer 3-1 having a thickness of 10 nm formed by vacuum deposition;

Pt layer 3-2 having a thickness of 50 nm formed by vacuum deposition; and

Au layer 3-3 having a thickness of 400 nm formed by vacuum deposition.

Figure 11A:
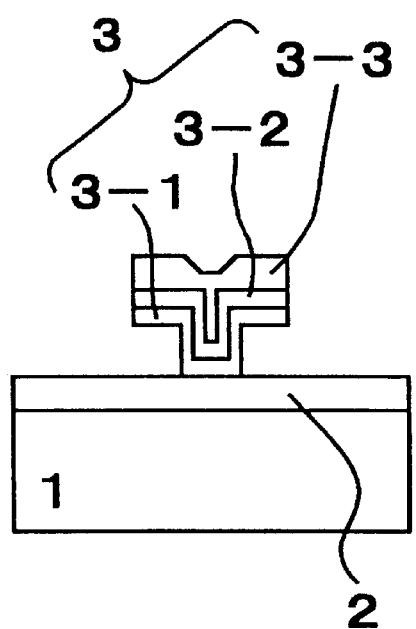
Figure 11B:
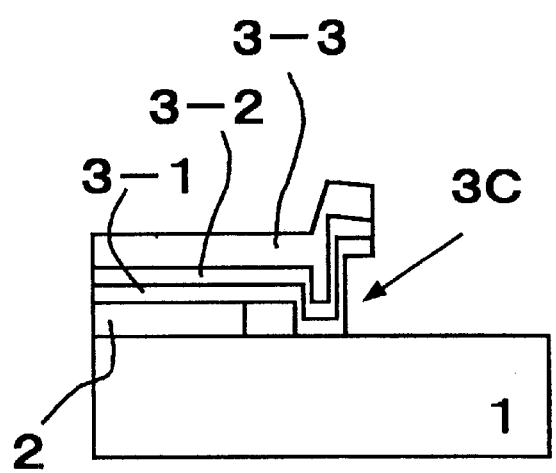

Next, the resist layer 10 and the first and second resist laminas 11,12 are removed with the gate electrode material thereon, and thus the gate electrode 3 is completed, as shown in FIGS. 11A and 11B.

These resist layers 10 to 12 are removed under the following conditions.

Etchant: a mixed solution of an aromatic compound and an amine

Removing time: 10 min

Figure 12:
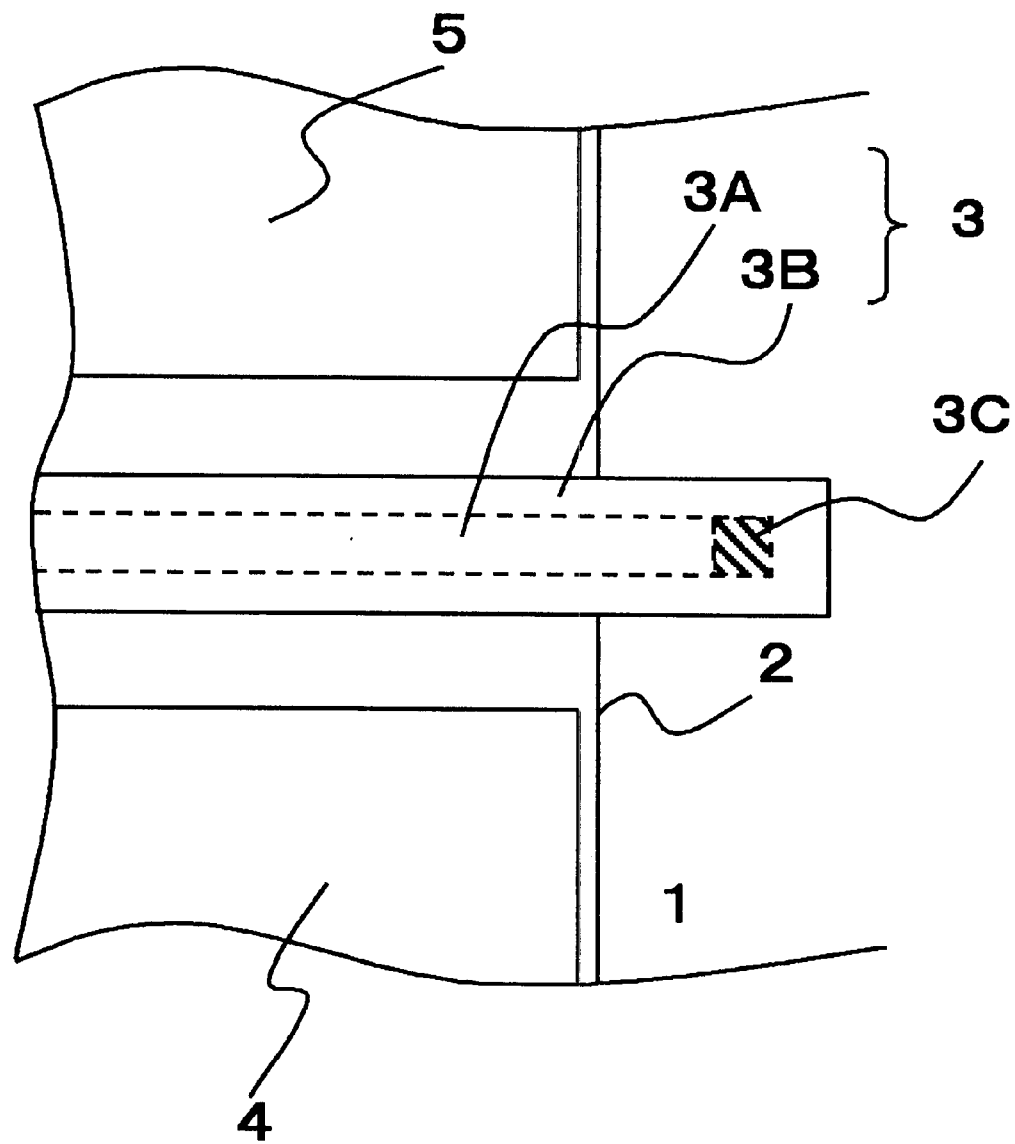
FIG. 12 is a sectional view of a field effect transistor according to the first embodiment of the present invention.

As shown FIG. 12, the end of the gate electrode 3 has the support 3C serving as a supporting portion formed in the support pattern 40 shown in FIG. 8B.

According to the first embodiment, the supporting gate 3C supports the gate electrode 3, so that the mesa layer 2 does not support the overhanging gate electrode 3 by itself in a cantilever manner. As a result, the gate electrode 3 is subjected to less stress, thereby being prevented from separating from the mesa layer 2. In addition, since the support 3C lies away from the mesa layer 2, it does not cause shortcircuiting even if any operating layer extends to the vicinity of the mesa layer 2.

Second Embodiment

Figure 13:
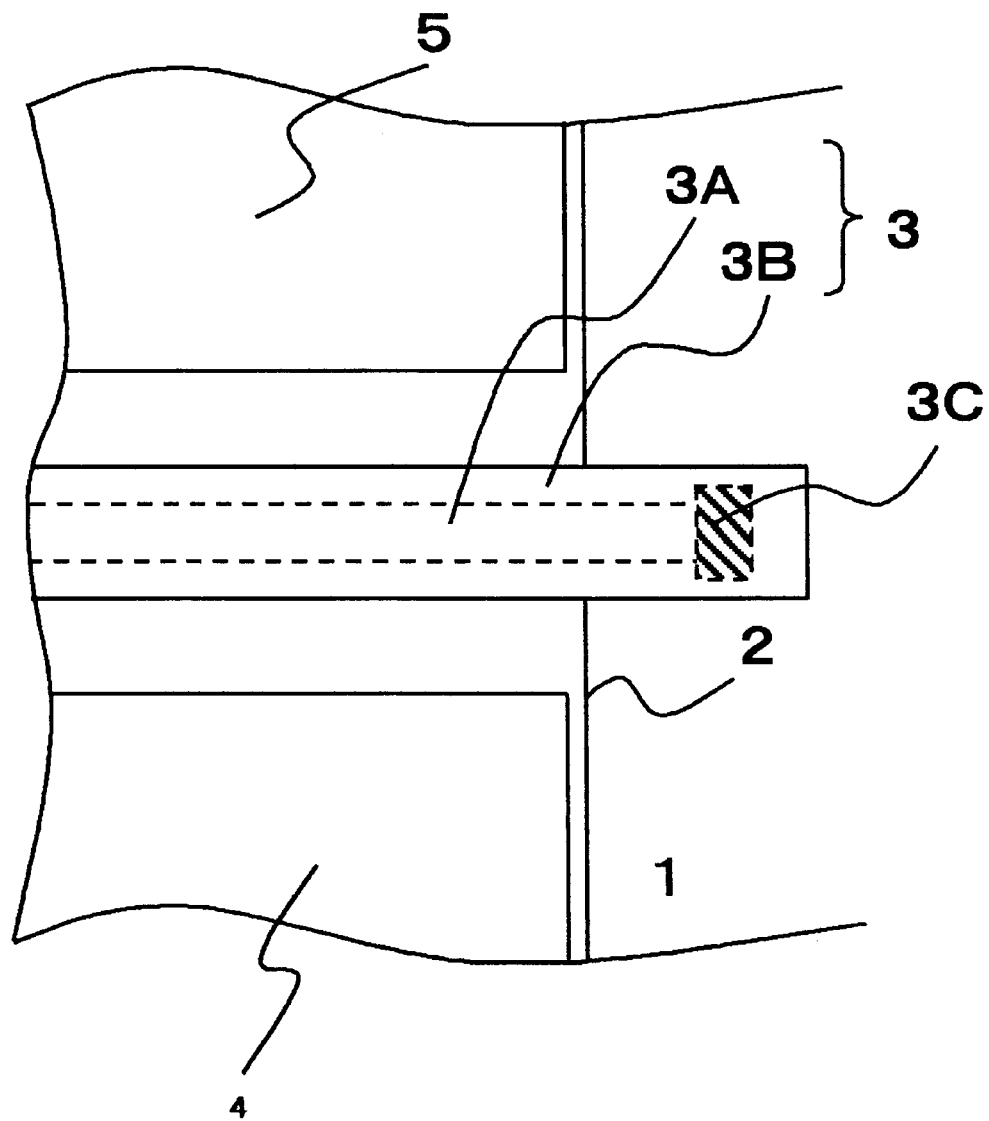
FIG. 13 is a sectional view of a field effect transistor according to a second embodiment of the present invention.

A second embodiment will now be described with reference to FIG. 13. FIG. 13 is a plan view showing an end of a gate electrode according to the second embodiment.

In the second embodiment, the support 3C is formed so as to extend in the gate length direction more than the fine gate 3A in plan view.

This structure increases the contact area of the support 3C and the substrate 1, thus ensuring the supporting of the gate electrode 3.

Third Embodiment

Figure 14:
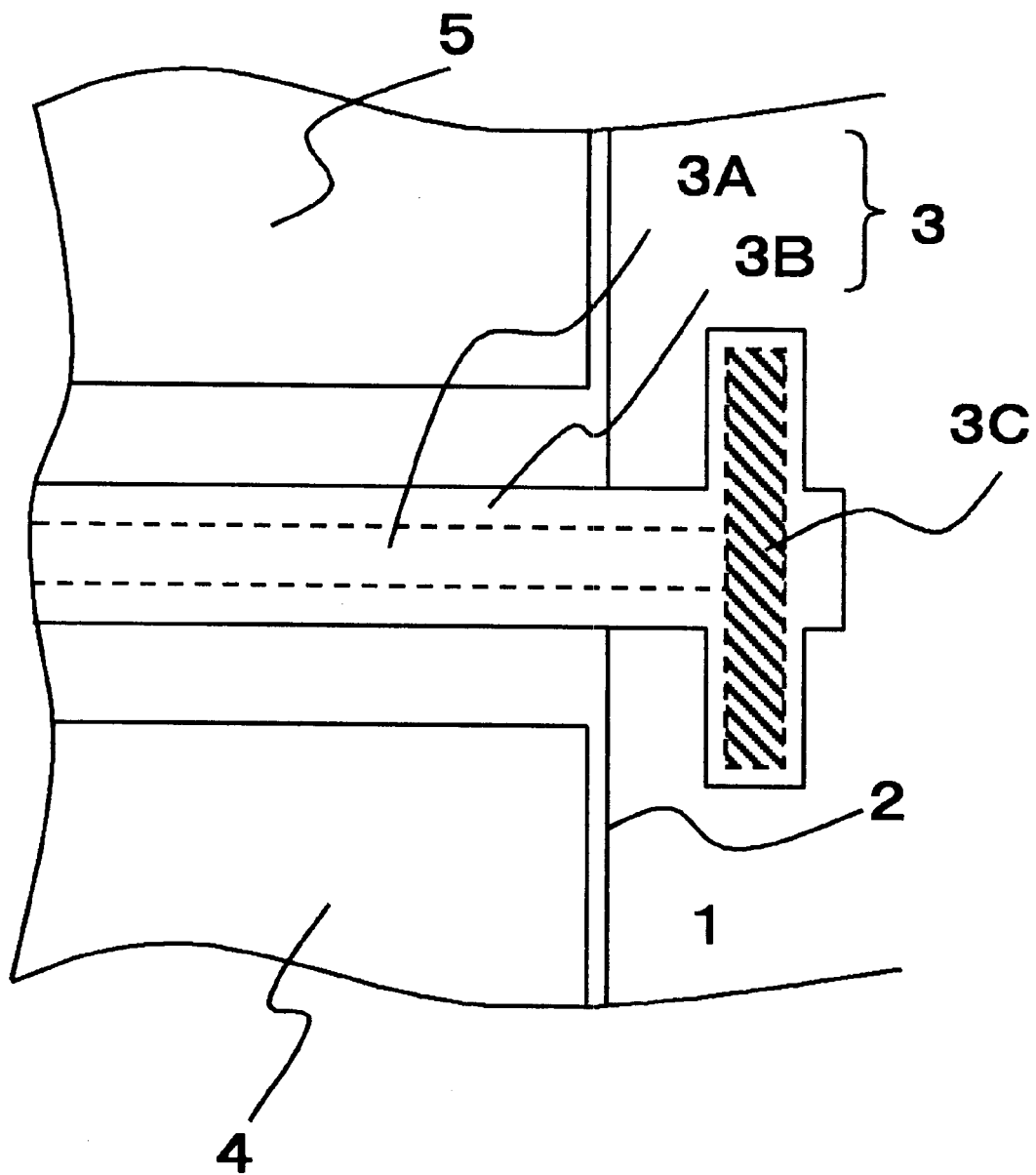
FIG. 14 is a sectional view of a field effect transistor according to a third embodiment of the present invention.

A third embodiment will now be described with reference to FIG. 14. FIG. 14 is a plan view showing an end of the gate electrode according to the third embodiment.

The support 3C described with reference to FIG. 13 cannot have a larger width than that of the over gate 3B. This is because the support 3C is formed by a lift-off process in which the supporting gate 3C cannot extend beyond the opening for forming the over gate 3B defined by the overhang portion of the second resist lamina 12. In the third embodiment, therefore, the width of the over gate 3B is partly expanded so that the support 3C has a much larger width and area.

In the third embodiment, the support 3C extends in the gate length direction, thus preventing the transistor from occupying a larger area in the direction perpendicular to the gate length direction, or the longitudinal direction of the gate electrode 3. Thus, the area of the gate electrode 3 extending to the outside of the mesa layer 2, which is originally not for any device area, is minimized.

Although the gate electrode 3 has the over gate 3B in the embodiments described above, the present invention, obviously, is applied to other semiconductor devices having a gate electrode composed of an equivalent for the fine gate 3A.

Also, semiconductor devices used in the present invention may comprise InP, GaAs, GaN, or Si, and may have a high electron mobility transistor (HEMT) or a bulk channel structure.

The resulting field effect transistor, in which the gate electrode is subjected to less stress, according to the present invention achieves stable transistor characteristics and improves the process yield.

What is claimed is:

1. A method of manufacturing a semiconductor device having a mesa layer formed on a semiconductor substrate, comprising:

a step of forming a resist layer overlaying the mesa layer on the substrate, so that the resist layer has a thick part in the vicinity of the mesa layer, the thick part having a thickness larger than that of the resist layer on the mesa layer;

a first exposing step for transferring a gate electrode pattern on to the resist layer, the gate electrode pattern defining a first opening in the resist layer, the first opening determining a shape of a gate electrode;

a second exposing step for transferring a support pattern on to the resist layer, the support pattern defining a second opening in the resist layer, the second opening determining a shape of a support which props an end of the gate electrode, piercing through the resist layer and overlapping with an end of the first opening in the thick part of the resist layer;

a developing step for developing the gate electrode pattern and the support pattern exposed in the resist layer to form the first opening and the second opening, so that the first opening and the second opening are combined into a third opening formed in the resist layer and that a resist pattern having the third opening therein is formed;

a step of depositing a material of the gate electrode on the substrate over the resist pattern; and a step of forming the gate electrode and the support in one body with the material by lifting off the material deposited on the resist pattern.

2. A method of manufacturing a semiconductor device according to claim 1, wherein the second exposing step precedes the first exposing step.

3. A method of manufacturing a semiconductor device according to claim 1 or 2, wherein the gate electrode pattern and the support pattern exposed in the resist layer are simultaneously developed to form the resist pattern.

4. A method of manufacturing a semiconductor device according to claim 1 or 2, wherein each of the gate electrode pattern and the support pattern exposed in the resist layer is individually developed.

5. A method of manufacturing a semiconductor device according to claim 1, wherein the second exposing step is performed after developing the gate electrode pattern exposed by first exposing step.

6. A method of manufacturing a semiconductor device according to claim 2, wherein the first exposing step is performed after developing the support pattern exposed by second exposing step.

7. A method of manufacturing a semiconductor device according to claim 1, wherein an area in which the substrate surface appears at the bottom of the second opening has a width smaller than that of the gate electrode in the gate length direction.

8. A method of manufacturing a semiconductor device according to claim 1, wherein an area in which the substrate surface appears at the bottom of the second opening has a width larger than that of the gate electrode in the gate length direction.

9. A method of manufacturing a semiconductor device according to claim 1, wherein the gate electrode comprises a fine gate and an over gate formed on the fine gate, the over gate having a width larger than that of the fine gate.

10. A method of manufacturing a semiconductor device according to claim 9, wherein the gate electrode pattern results in an opening for forming the fine gate.

11. A method of manufacturing a semiconductor device according to claim 9, further comprising a step of forming a fourth opening for forming the over gate electrode, wherein the fourth opening is formed in an upper resist layer disposed on the resist layer.

12. A method of manufacturing a semiconductor device according to claim 11, wherein the upper resist layer comprises an overhang portion which protrudes over the fourth opening from a top of the upper resist layer.

13. A method of manufacturing a semiconductor device according to claim 12, wherein the upper resist layer has a laminated structure comprising a first resist lamina in which the lower part of the fourth opening is formed and a second resist lamina which is formed into the overhang portion.

* * * * *